(12) United States Patent
Ohtsuki et al.

(10) Patent No.: US 6,857,880 B2
(45) Date of Patent: Feb. 22, 2005

(54) ELECTRICAL CONNECTOR

(76) Inventors: Tomonari Ohtsuki, c/o DDK LTD., 2-11-20, Nishi-gotanda, Shinagawa-Ku, Tokyo (JP); Yasue Yamazaki, c/o DDK LTD., 2-11-20, Nishi-gotanda, Shinagawa-Ku, Tokyo (JP)

(*) Notice: Subject to any disclaimer, the term of this patent is extended or adjusted under 35 U.S.C. 154(b) by 88 days.

(21) Appl. No.: 10/277,539

(22) Filed: Oct. 22, 2002

(65) Prior Publication Data

US 2003/0092293 A1 May 15, 2003

(30) Foreign Application Priority Data

Nov. 9, 2001 (JP) .................................. 2001-344753
Aug. 6, 2002 (JP) .................................. 2001-228911

(51) Int. Cl.$^7$ ...................... H01R 12/00; H05K 1/00
(52) U.S. Cl. ........................................................ 439/66
(58) Field of Search ........................................... 439/66

(56) References Cited

U.S. PATENT DOCUMENTS 5,701,233 A * 12/1997 Carson et al. .............. 361/735
6,071,400 A * 6/2000 Schroder et al. ........... 205/686

* cited by examiner

*Primary Examiner*—Javaid H. Nasri
(74) *Attorney, Agent, or Firm*—Baker Botts L.L.P.

(57) ABSTRACT

An electrical connector includes an elastomer layer or board and a plurality of fine lead wires embedded in the elastomer layer and extending rectilinearly therein at right angles to both the surfaces of the elastomer layer. Recesses are formed in the elastomer layer around peripheries of openings of through-holes in which the fine lead wires are embedded. The electrical connector further includes two flexible printed circuit boards on both the sides, each including electric contacts to be connected to mating contacts, connection portions each formed with a through-hole passing therethrough, and conductors each electrically connecting the connection portion to the electric contact. When the flexible printed circuit boards and the fine lead wires are electrically connected by vapor reflow soldering, the flexible printed circuit boards and the elastomer layer having the fine lead wires embedded therein are clamped by restraining jigs to prevent from the flexible printed circuit boards from moving away from the elastomer layer. With this arrangement, reliable connection between the fine lead wires and the flexible printed circuit boards can be achieved without need to control the length of the fine lead wires without any risk of the flexible boards being deflected or warped during soldering even if circumferences of portions to be electrically connected are covered by the insulator.

11 Claims, 12 Drawing Sheets

ELECTRICAL CONNECTOR

BACKGROUND OF THE INVENTION

This invention relates to an electrical connector, and more particularly to an electrical connector having electric contacts on both sides.

In order to inspect performance of semiconductor elements of a ball grid array package having a plurality of electric contacts in the form of a hemispherical protrusion made of solder or the like, for example, a socket connector has been used, which is detachably fitted with the ball grid array package. Such a socket connector includes a desired number of electric contacts to be connected to the electric contacts made of solder of the ball grid array package. Some socket connectors have electric contacts of as many as several hundreds in the largest number case. Their electric contacts are arranges with extremely narrow pitches, typically 0.8 mm. Such electric contacts are often arranged on a flexible printed circuit board.

As described above, several hundreds, of the electric contacts are arranged with extremely narrow pitches. In the case that, for example, there are four hundred electric contacts arranged in twenty rows each having twenty contacts, it is required that a signal from one electric contact located, for example, at the center of them is transmitted through a lead wire leading through one edge of a flexible printed circuit board to an exterior equipment. In such a case, the lead wire must pass between at least nine rows of contacts and its length passing therebetween may become at least 0.8 mm×9=7.2 mm, and at the outermost rows as many as nine lead wires must be arranged between two adjacent electric contacts.

On the other hand, in the case that electric contacts are 0.3 mm in diameter and arranged with a pitch of 0.8 mm, the space in which lead wires are arranged becomes 0.8 mm−0.3 mm=0.5 mm. In order to arrange nine lead wires in such a narrow space, a diameter of the lead wires is 0.5 mm÷19= 0.026 mm, assuming that a ratio of lead wire diameter to space is 50%. Therefore, forming a circuit with a good transmission line becomes very difficult because to the space is far too small for the lead wires.

In view of such a difficulty to provide lead wires, the inventors of the present application attempted to use, for surface treatment of electric contacts, the electroless plating which needs no electrical connection to plating electrodes, for the purpose of providing circuits on the opposite surface of a board utilizing through-holes formed therein.

However, the electroless plating is time-consuming. For example, it takes 1 to 1.5 hours for providing plated layers of as little as 5 micrometers on electric contact elements. Therefore, a flexible circuit board must be kept immersed in a plating bath which is alkaline for a long period of time, creating a risk of copper foils on the board being partially peeled or removed. The inventors, therefore, have attempted to obtain plated electric contact elements by electrolytic plating instead of electroless plating.

On the other hand, an electrical connector has been used, which has an elastomer layer or board between the circuit boards and the electronic components. The elastomer or board is made of a silicone rubber or the like having a plurality of fine lead wires embedded therein and extending in the width direction of the elastomer layer. The elastomer layer is further provided on both surfaces with electric contacts connected to their respective lead wires to electrically connect the circuit boards and the electronic components.

With a connector of this kind, in order to ensure the electrical connection between the circuit boards and the electronic components, the electronic components are forced against the circuit boards. For this purpose, the fine lead wires embedded in the elastomer layer extend rectilinearly at right angles to both the surfaces of the elastomer layer, and both the ends of the fine lead wires extend slightly beyond both the surfaces of the elastomer layer to form an electrical connector having electric contacts on both the surfaces as disclosed, for example, in Japanese Patent Application No. 2001-270,521.

In order to reduce the self-inductance of lead wires electrically connecting therebetween for the high speed signal transmission, these lead wires need to be as short as possible in length and as large as possible in diameter and to be formed of a material of high conductivity.

In such an electrical connector, moreover, it is difficult to embed the fine lead wires in an elastomer layer or board in a manner such that the overall lengths of the fine lead wires are exactly embedded in the elastomer layer with its thickness completely coincident with the lengths of the fine lead wires. Consequently, on one side, the ends one ends of the fine lead wires are buried in the elastomer layer, but the other ends extend slightly beyond the surface of the layer. Extruding forces, acting upon the elastomer layer from the fine lead wires are thus different between one surface and the other of the elastomer layer or board, causing the elastomer layer to warp or bend.

In the manufacturing process for such an electrical connector, both surfaces of the elastomer layer are jointed to flexible printed circuit boards each including electric contacts adapted to contact mating contacts, an insulating board formed with through-holes extending therethrough and conductors electrically connecting the electric contacts through the through-holes in a manner such that both the ends of fine lead wires extending slightly beyond both the surfaces of the elastomer layer in which the fine lead wires are embedded are aligned with and extend into the through-holes of the flexible printed circuit boards.

However, if the elastomer layer is warped or bent as described above, there would have been clearances between the ends of the fine lead wires and the insulating board at the through-holes, into which edges of the holes of the elastomer layer embedding the fine lead wires therein would enter the clearances, thereby reducing the contacting surfaces between the fine lead wires and the through-holes of the insulator boards. As a result, the fine lead wires and the flexible printed circuit boards are poorly soldered with a lower solderability, so that during repeated connection action the mating contacts, there is a tendency for the peeled solder metal to cause defective or failed connection of the connector.

While the fine lead wires are being urged after they are brought into the predetermined positions relative to the elastomer layer, an electrical connection between the flexible printed circuit boards and the fine lead wires is often impossible because the shoulders of the fine lead wires and their proximities are covered by the elastomer layer.

Moreover, the heat during the reflow soldering causes the thermal expansion of the flexible printed circuit boards so that circuit boards will warp to move away from the shoulders of the fine lead wires, as a result of which the desired connections become impossible. Even if, the connections overcome the warp, they will be attended by poor solderability with insufficient soldering strength.

Furthermore, it is envisioned that the reflow soldering is performed, while the flexible printed circuit boards are clamped by means of jigs or the like, in order to prevent the flexible printed circuit boards from moving away from the shoulders of the fine leading wires. In the case that the portions to be connected are numerous and arranged in high density, the positions restrained by the jigs are limited to very narrow areas so that frame members of the jigs are inevitably thin rods. Moreover, because the jigs are necessarily exposed to high temperatures under high stresses, the material of the jigs is limited to a metal because of its heat resistance and worked accuracy.

Unfortunately, a jig made of a metal has a great heat capacity, so that in order to raise the temperature of the portions to be soldered to a temperature required for the reflow soldering by the use of heated air, infra-red radiation or the like, heat needs to be supplied at a much higher temperature or for a much longer period of time. However, such a large amount of heat would adversely affect various parts directly or indirectly related to the electrical connector, resulting in damage to these parts.

SUMMARY OF THE INVENTION

It is an object of the invention to provide an improved electrical connector which eliminates all the disadvantages of the prior art and which is well-adapted to high speed transmission signals and easy to manufacture without any need to give an attention to lengths of fine lead wires and without any warp of elastomer layers, as a result of which the fine lead wires and flexible printed circuit boards can be securely electrically connected even if the ends of the fine lead wires are covered by the insulators.

It is another object of the invention to provide an electrical connector and a method for producing it, which is manufactured in a short period of time without peeling of copper foils on a flexible printed circuit board and suitable for extremely short transmission lines in consideration of transmission line characteristics.

In order to accomplish the above objects, a connector having electric contacts on both surfaces according to the invention, comprises an elastomer layer, and a plurality of fine lead wires embedded in the elastomer layer and extending rectilinearly therein at right angles to both surfaces of the elastomer layer, recesses being formed in the elastomer layer around peripheries of openings of through-holes in which the fine lead wires are embedded.

The overall length of the fine lead wires may be substantially equal to the thickness of the elastomer layer or board. As an alternative, both the ends of the fine lead wires may extend slightly beyond both the surfaces of the elastomer layer or board.

Jointed to both surfaces of the elastomer layer are flexible printed circuit boards each comprising electric contacts to be connected to mating contacts, connection portions each formed with a through-hole passing therethrough, and conductors each electrically connecting the connection portion to the electric contact in a manner such that the both the ends of fine lead wires embedded in the elastomer layer are aligned with the through-holes of the connection portions.

The recesses are substantially frustoconical or of a substantially disc shape. Such shaped recesses are easy to form. As an alternative, the recesses may be of a dish shape or a shape tapered off toward outward. So long as the recess can prevent any bulge around the periphery of the aperture and can provide a space for soldering between the fine lead wire and the through-hole of the connection portion of the flexible printed circuit board, any cross-sectional shape of the recess may be used.

The fine lead wires to be embedded in the elastomer layer are each formed with at least one smaller diameter portion in order to increase the force for holding the fine lead wires in the elastomer layer. In more detail, parts of the elastomer layer extend or protrude toward the smaller diameter portions of the fine lead wires to prevent the lead wires from sliding or creeping out of the elastomer layer. By preventing the lead wires from sliding out of the elastomer layer, the fine lead wires are stably held in the elastomer layer to prevent the warping of the elastomer layer and hence defective or failed connection.

Restraining jigs are used to prevent the flexible printed circuit boards from moving away from the elastomer layer, and the flexible printed circuit boards and the fine lead wires of the elastomer layer can be easily soldered by vapor reflow soldering.

In another aspect of the invention, the electric contacts are electrically independent of one another after an electrolytic surface treatment by cutting off electrical connections between the electric contacts for the electrolytic surface treatment.

In a further aspect of the invention, the electric contacts each form an electric contact element with a conductor electrically connecting the electric contact to the opposite side of a board through a through-hole formed in the board, and the electric contact elements are electrically independent of one another after electrolytic surface treatment by cutting off electrical connections between the electric contact elements for the electrolytic surface treatment.

It is preferable that the electrical connections between the electric contacts or electric contact elements are cut off by forming substantially U-shaped slits around the electric contacts after surface treatment. Since the substantially U-shaped slits are inherently needed for the electrical connector, by forming the U-shaped slits in the last step the electrical connections between the electric contacts or electric contact elements can be cut off after the surface treatment without requiring an additional manufacturing step.

In one aspect of the invention, a method for producing an electrical connector having a required number of electric contacts adapted to contact mating electric contacts, comprises an electric contact element producing step which comprises steps of forming a pattern on one surface of a board, removing unwanted copper foils by etching, applying a predetermined electrolytic surface treatment to electric contact elements, and cutting off electrical connections between the electric contact elements by any one of laser beam machining, punching and the like to render the electric contact elements electrically independent of one another.

In a further aspect of the invention, in a method for producing an electrical connector having a required number of electric contacts adapted to contact mating contacts, including steps of forming electric contact elements, each having one electric contact and a conductor electrically connecting the electric contact to the opposite side of a board through a through-hole formed in the board; electrically connecting the electric contact elements for performing electrolytic surface treatment; and after the surface treatment, forming substantially U-shaped slits around the electric contacts to render the electric contact elements electrically independent of one another, according to the invention the step of forming the electric contact elements comprises steps of forming prepared through-holes, performing a surface treatment of the through-holes and a whole surface of the board, forming a pattern on the surface of the board, removing unwanted copper foils by etching, attaching a covering layer onto the whole surface, partly removing the covering layer at locations corresponding to the electric contacts to expose them, applying the electrolytic surface-treatment onto the electric contacts, opening the covering layer at the through-holes, and forming the substantially U-shaped slits around the electric contacts.

The features explained as to the electrical connectors having electric contacts only on one side in the above description can be applied to an electrical connector having electric contacts on both sides. For example, such an electrical connector comprises a support member, a first circuit having a plurality of electric contact elements adapted to contact first mating contacts and arranged on one surface of the support member, a second circuit having a plurality of electric contact elements adapted to contact second mating contacts and arranged on the other surface of the support member, and conductors for connecting the first and second circuits. In this case, the electric contact elements of the first and second circuits are formed in the most suitable shapes with respect to the shapes of the mating contacts.

In this manner, it is possible to produce the electrical connector suitable for extremely short transmission lines in consideration of transmission line characteristics without requiring any study of microstrip line structure. The expression "the most suitable shapes" is intended to mean that shapes of the electric contact elements to contact the first and second mating electric contacts are varied depending on shapes of the first and second mating electric contacts, respectively. For example, in the case that the mating electric contacts are ball grid array tips, the electric contact elements are formed in the form of a triangular wave, while if the mating contacts are flat as pads, the contact elements are formed as hemispherical protrusions.

In electrically connecting the first and second circuits, electrically conductive members are inserted into the through-holes around the electric contact elements and then soldered thereto, thereby forming the extremely short transmission lines without any loss of elasticity of the electric contact elements.

As a result of providing the substantially U-shaped slits around the electric contact elements, when the electric contact elements of the connector are brought into contact with and urged to the mating contacts, the pieces of the board surrounded by the U-shaped slits may be deformed in a cantilevered manner with the aid of an elastic material attached to the opposite surface of the board. Consequently, with the deformation of the pieces supporting the electric contact elements thereon, the contact points between the contact elements and the mating electric contacts are displaced so that the mating contacts slidably move on the electric contact elements to scrape off the solder accumulations or formations on the electric contact elements, which have been formed on being previously contacted.

The invention can bring about the following significant functions and effects.

(1) The electrical connector having electric contacts on both the sides can be easily produced by inserting and embedding fine lead wires in an elastomer layer or board according to the invention.
(2) According to the invention, no matter how narrow the pitches of the electric contacts, minimum required diameters of the fine lead wires are achieved so that the self-inductance can be decreased.
(3) According to the invention, the fine lead wires having predetermined diameters can be easily embedded in the elastomer layer, and it is therefore possible that an elastomer layer having fine lead wires embedded therein is jointed to flexible printed circuit boards suitable for high speed transmission signals to the elastomer layer with ease.
(4) As conductive distances between contacts are very short in the electrical connector according to the invention, when high speed signals are measured and inspected, insertion losses can be significantly reduced similar to a socket connector.
(5) According to the invention, there are recesses around the peripheries of apertures of the elastomer layer in which the fine lead wires are embedded. Connection portions of the flexible printed circuit boards are be brought into contact with the shoulders of the fine lead wires to obtain the sufficient strength of soldered portions.
(6) According to the invention, the flexible printed circuit boards and the elastomer layer are clamped by means of jigs to prevent the connection portions of the flexible printed circuit boards from moving away from the elastomer layer or board, and then the connection portions of the flexible printed circuit boards are soldered to the shoulders of the fine lead wires by vapor reflow soldering. Therefore, they are securely soldered with sufficient soldering strength.
(7) According to the invention, the connection portions of the flexible printed circuit boards are only in contact with the shoulders of the fine lead wires without insertion of the fine lead wires into the through-holes of the flexible printed circuit boards, so that the soldering can be easily carried out without any attention being paid to the strength of the fine lead wires.
(8) According to the invention, as the fine lead wires to be embedded in the elastomer layer have smaller diameter portions, when the fine lead wires are inserted into the elastomer layer, parts of the elastomer layer may protrude toward the smaller diameter portions so as to hold the fine lead wires in the elastomer layer with higher stability to prevent the fine lead wires from sliding out of the elastomer layer.
(9) According to the invention, there are recesses around the peripheries of apertures of the elastomer layer in which the fine lead wires are embedded, the elastomer layer is prevented from being warped so that the connection portions of the flexible printed circuit board and the shoulders of the fine lead wires are securely held in contact with one another to prevent any defective connection which would otherwise occur.

The present invention can further bring about the following functions and effects.

(1) According to the invention, electrical connections between electric contacts or electric contact elements for their surface treatment can be simply cut off by laser beam machining, punching or the like after the surface treatment to render electrically independent of one another, thereby providing an electrical connector for extremely short transmission in consideration of transmission line characteristics.
(2) According to the invention, forming substantially U-shaped slits in the last process for causing the mating electric contacts to slide on the electric contact elements achieves simultaneously the cutting operation of electrical connections between electric contacts or electric contact elements with ease without increasing any additional step.
(3) According to the invention, by forming the circuits of the flexible printed circuit board by utilizing the electrolytic plating, the time required for manufacture can be shortened by about ten hours from the case of using electroless plating, and peeling of copper foils of flexible printed circuit board can be eliminated.

(4) According to the invention, circuits can be easily formed even if there are differences in surface treatment thickness between the electric contact elements and through-holes.

(5) According to the invention, when layers of as much as 100 micrometers in thickness are applied onto electric contact elements by the surface treatment, it can be completed for only about one hour, which makes it easy to produce the electrical connector.

(6) In the case of connecting the electrical connector to first and second mating connectors according to the invention, the conductive distances between contacts are less than 5 mm by forming the electric contact elements of the first and second circuits in the most suitable shapes with respect to the shapes of the mating contacts. In measurement and inspection, consequently, the extremely short transmission lines are possible without requiring any particular precaution and without forming microstrip lines in consideration of characteristics as transmission lines, thereby contributing to reduction in cost.

(7) In order to make conductive the first and second circuits according to the invention, conductive members are inserted in through-holes provided near the electric contact elements and then soldered thereat, thereby enabling the first and second circuits to be electrically connected and enabling surface treatment to be applied to required portions with required thicknesses without loss of elasticity of the electric contact elements.

The invention will be more fully understood by referring to the following detailed specification and claims taken in connection with the appended drawings.

DESCRIPTION OF THE PREFERRED EMBODIMENTS

Figure 1A:
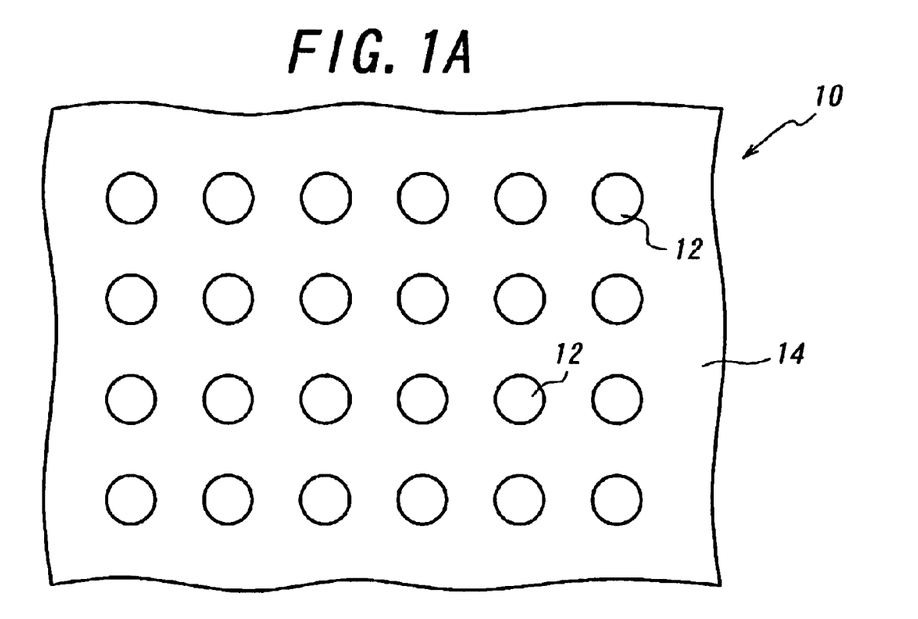
FIG. 1A illustrates in a plan view of an electrical connector, by way of example.
Figure 1B:
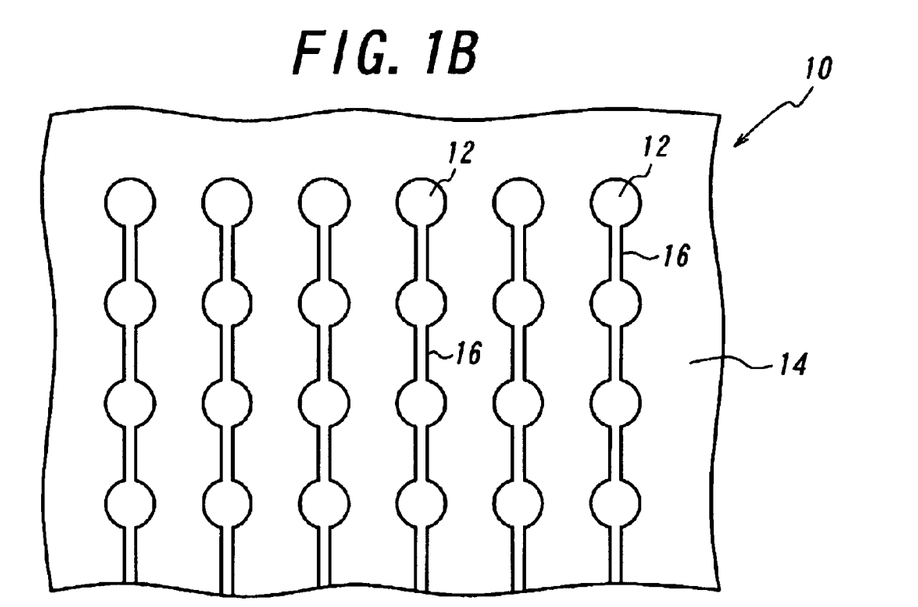
FIG. 1B is a view illustrating the electric contacts connected by lead wires for electrolytic plating, of the electrical connector shown in FIG. 1A.

Shown in FIG. 1A is an electrical connector 10 provided with only a plurality of electric contacts 12 on a flexible printed circuit board 14 by way of example. In order to carry out the surface treatment of the electric contacts 12, the electroless plating is preferable for this purpose because power supply lead wires are not required. In practice, however, the electroless plating could not be carried out in this case due to problems such as longer process time and peeling of copper foils as described previously. Consequently, the electrolytic plating must be carried out even if there is a need for electrical connections between the electric contacts 12 as by power supply lead wires 16.

Figure 2:
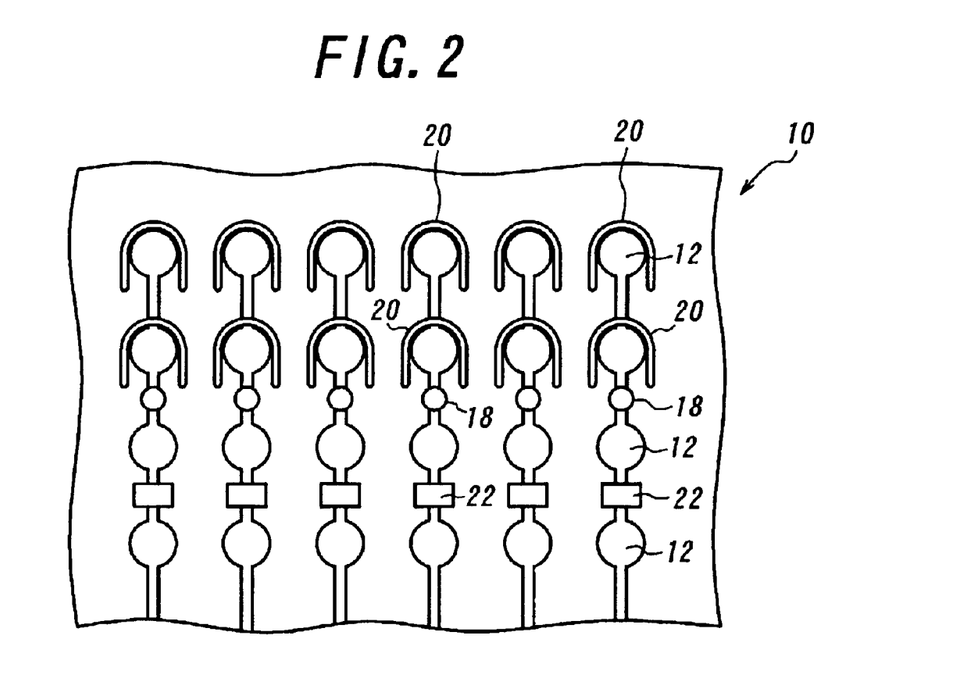
FIG. 2 is a view for explaining cutting off of the lead wires for power supply.

After the electrolytic surface treatment, however, it is required to cut off the electrical connections in order to render the respective electric contacts electrically independent of one another. The electrical connections can be cut off by forming apertures 18, rectangular slits 22 or U-shaped slits 20 in the board as shown in FIG. 2 by means of the laser beam machining, punching or the like.

Figure 3:
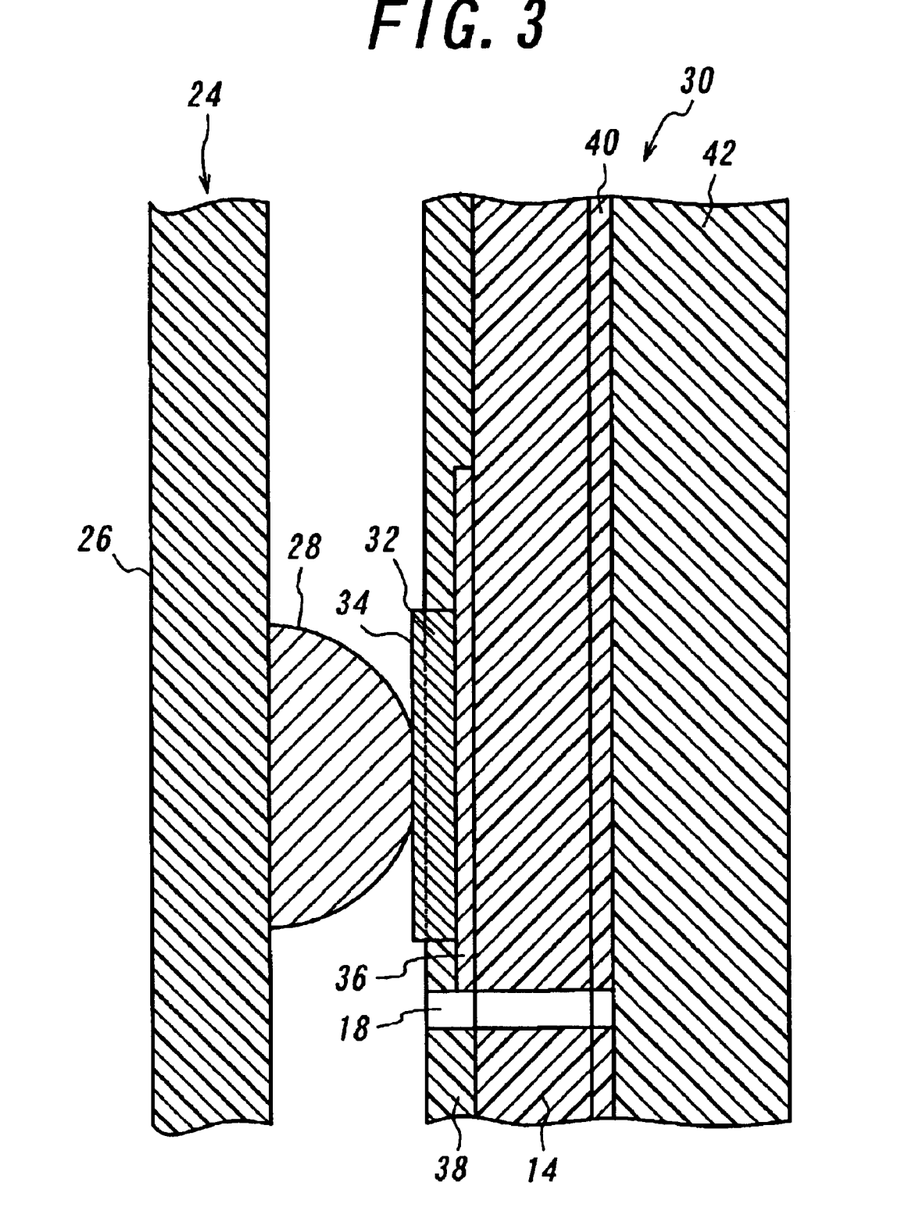
FIG. 3 is a partly sectional view of an electrical connector according to the invention.

An electrical connector according to an embodiment of the invention will be explained by referring to FIG. 3. In FIG. 3, an electrical connector 30 is to be connected to a mating ball grid array package 24 having a board or substrate 26 having a rigidity such as a hard resin, silicon or ceramic material and a plurality of contacts 28 formed of a solder in the form of a hemisphere on one side of the board 26.

Further explaining the construction of the electrical connector 30, it comprises a flexible printed circuit board 14 formed of a flexible or soft resin having a reasonable rigidity, disc-shaped conductors 36 each formed of a metal layer provided on one surface of the board 14, a protection covering layer 38 of an insulating material provided on the board 14 on the same side of the disc-shaped conductors 36, and electric contact elements 32 each provided on the disc-shaped conductor 36. The electrical connector 30 is of a socket construction onto which the mating ball grid array package 24 is detachably connected.

Figure 4:
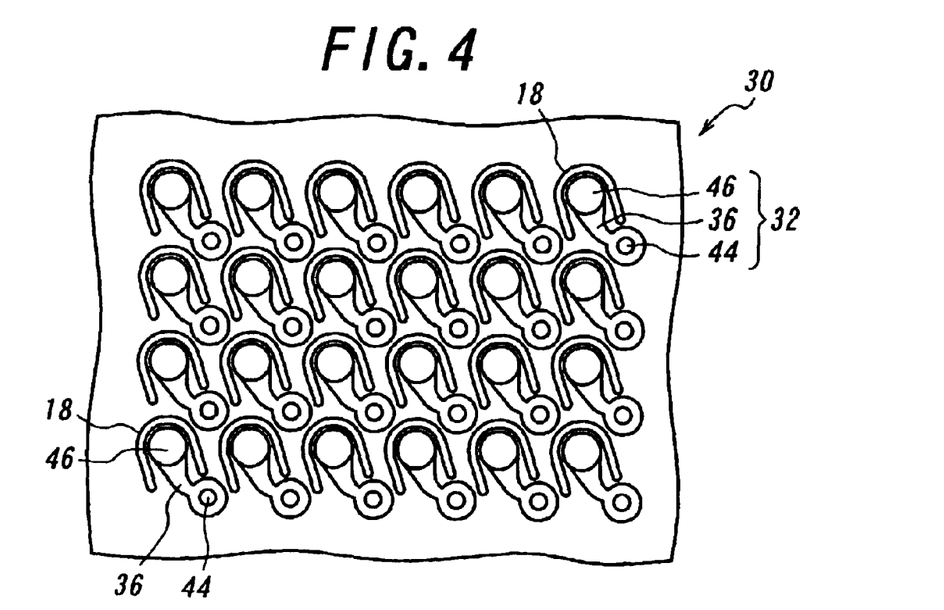
FIG. 4 is a partly plan view of the electrical connector shown in FIG. 3.
Figure 5:
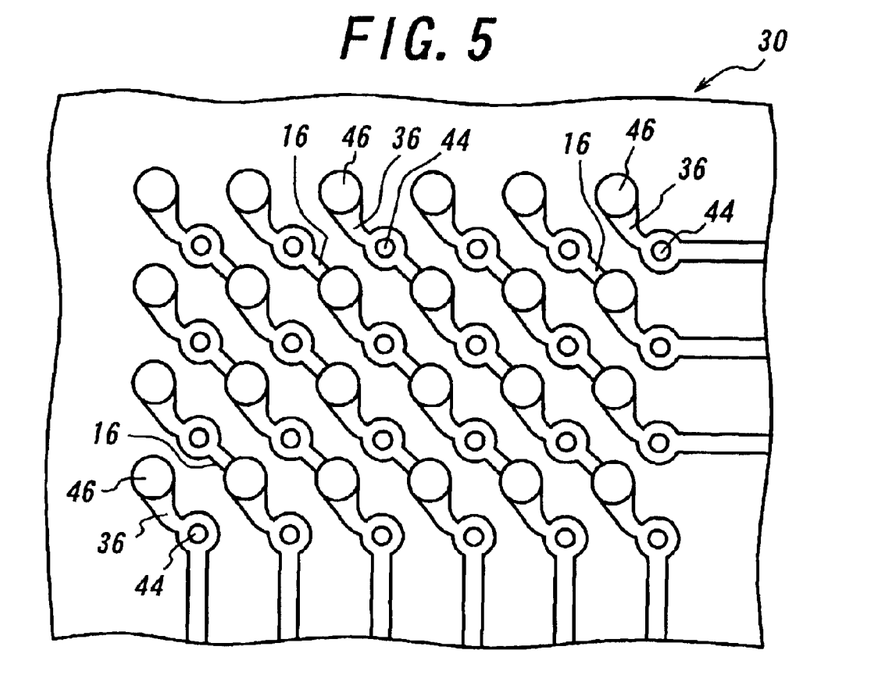
FIG. 5 is a view for explaining a method for processing electric contact elements of the electrical connector shown in FIG. 4.

FIG. 4 illustrates the ultimate arrangement on the flexible printed circuit board 14, which includes electric contacts 46 provided on the board 14, through-holes 44 each in the proximity of the electric contact 46 and passing through the board 14, and conductors 36 each connecting the electric contact 46 to the opposite side of the board 14 through the through-hole 44. In order to perform the surface treatment of the electric contacts 46, conductors 36 and the like by means of the electrolytic plating, it is required that the electric contact elements 32 are previously electrically connected to one another and further connected to applied electrodes as shown in FIG. 5. After the surface treatment, the connection portions 16 between the electric contact elements 32 are cut off in the manner described above to render the electric contact elements 32 independent of one another.

Figure 6:
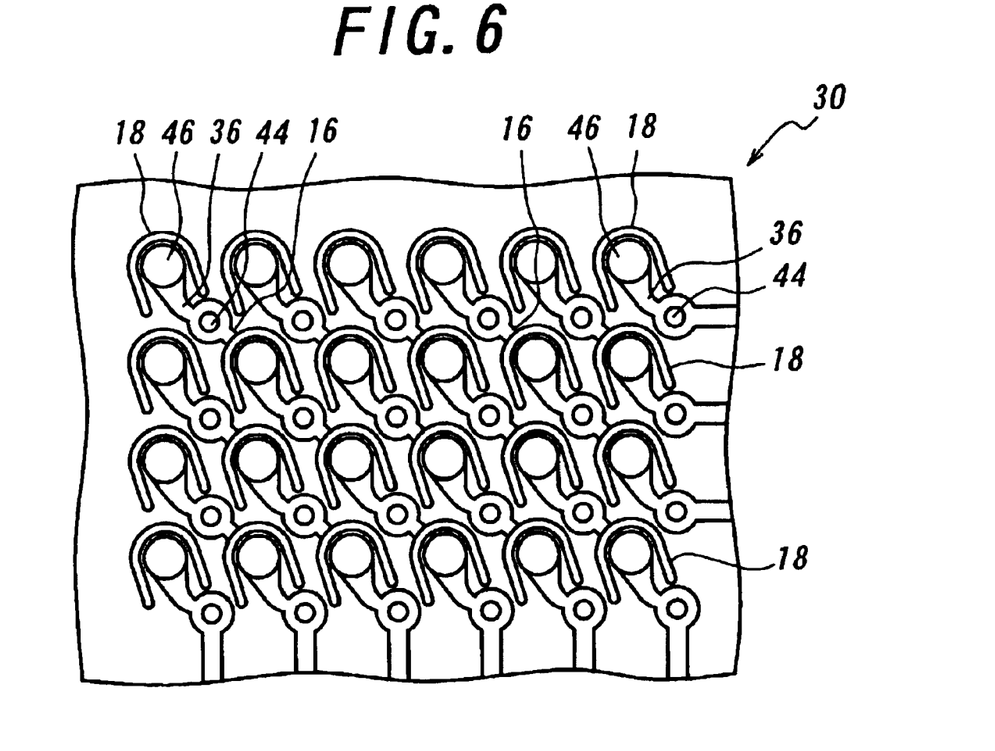
FIG. 6 is a view for explaining a method for cutting off lead wires for power supply of the electrical connector shown in FIG. 5.

With the electrical connector 30 shown in FIGS. 3 and 4, it is preferable to employ substantially U-shaped slits 18 provided around the electric contacts 46 in the final process step as shown in FIG. 6 in order to cut off the connection portions between the electric contact elements 32, which have been needed for the electrolytic surface treatment. When the contacts 28 of the ball grid array package 24 are brought into contact with the electric contact elements 32 of the electrical connector 30, the pieces of the board 14 surrounded by the substantially U-shaped slits 18 may be deformed in a cantilevered manner to achieve the sliding movement of the contacts 28 on the electric contact elements 32, thereby automatically removing solder accumulations which have adhered from the contacts 28 of the package 24 to the surfaces of the electric contacts elements 32 of the electrical connector 30. The electrical connector 30 inherently needs to have such substantially U-shaped slits 18 formed therein for the purpose of removing the solder accumulations, so that by performing the machining of the substantially U-shaped slits 18 in the last process, there is no need for an additional process for cutting the connection portions between the electric contact elements 32.

FIG. 6 illustrates the electrical connector 30 having a required number of electric contacts 46 adapted to contact mating contacts. Such electrical connector 30 is produced in the steps of forming electric contact elements 32 each consisting of an electric contact 46, a through-hole 44 formed in a board and a conductor 36 connecting the electric contact 46 to the opposite side of the board through the through-hole 44; electrically connecting these electric contact elements 32 to perform the electrolytic surface treatment; and thereafter forming the substantially U-shaped slits 18 around the electric contacts 46 to render the electric contact elements electrically independent of one another. In the method for producing such an electrical connector 30, the formation of the electric contact elements 32 is carried out in the following manner.

First, the board is formed with the prepared through-holes 44 and then subjected to the surface treatment on the formed through-holes 44 and the whole surface of the board.

Second, patterns are formed on the surface and then unwanted copper foils are removed by etching.

Third, a covering layer is attached to the whole surface.

Fourth, the covering layer is partly removed or opened at locations corresponding to the electric contacts 46 to expose them and the exposed electric contacts 46 are then subjected to the electrolytic surface treatment.

Fifth, the covering layer is partly removed or opened at locations 68 corresponding to the through-holes 44 to expose them.

Finally, the substantially U-shaped slits 18 are formed around the electric contacts 46.

Figure 7:
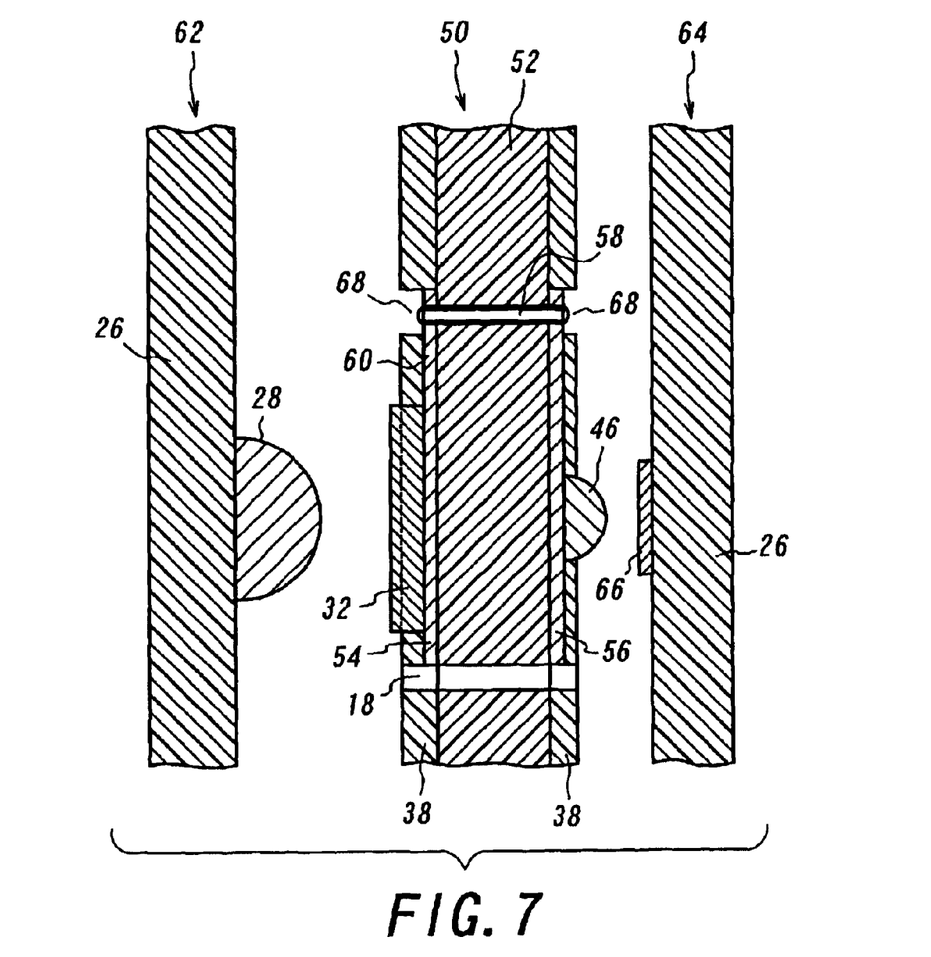
FIG. 7 is a partly sectional view of another electrical connector according to the invention.

FIG. 7 illustrates another electrical connector 50 which will be explained hereinafter The electrical connector 50 is adapted to be connected to two mating packages (a first and a second package 62 and 64) on both the sides of the connector 50. In more detail, the electrical connector 50 includes a supporting member 52, a plurality of electric contact elements 32 adapted to contact electric contacts 28 of the first mating package 62, a first circuit 54 arranged on the surface of the supporting member 52 on the same side as the electric contact elements 32, electric contacts 46 adapted to contact electric contact elements 66 of the second mating package 64, a second circuit 56 arranged on the surface of the supporting member 52 on the same side as the electric contacts 46, and conductors (lead wires) 60 connecting the first and second circuits 54 and 56.

In other words, the electrical connector 50 includes the two circuits 54 and 56 arranged each on one side of the connector 50. The electric contact elements 32 and the electric contacts 46 of the first and second circuits 54 and 56 are so designed to have optimum shapes with respect to shapes of the mating contacts of the first and second packages 62 and 64.

Figure 8:
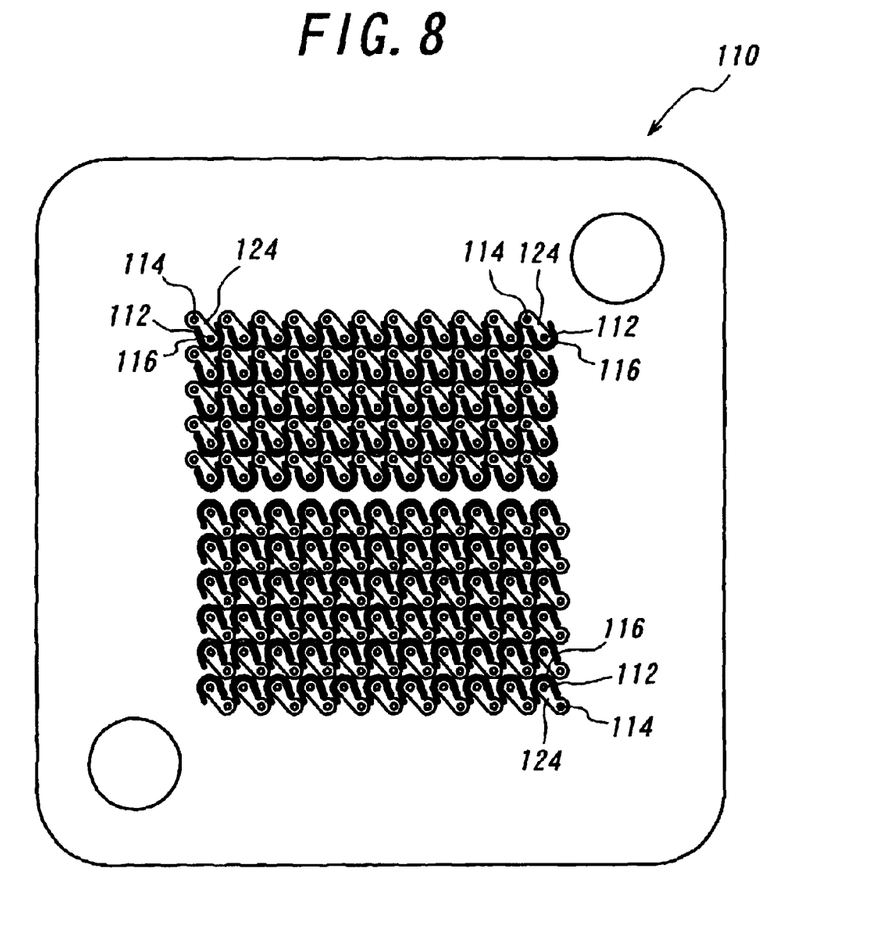
FIG. 8 is a top plan view of an electrical connector according to one aspect of the invention.
Figure 9:
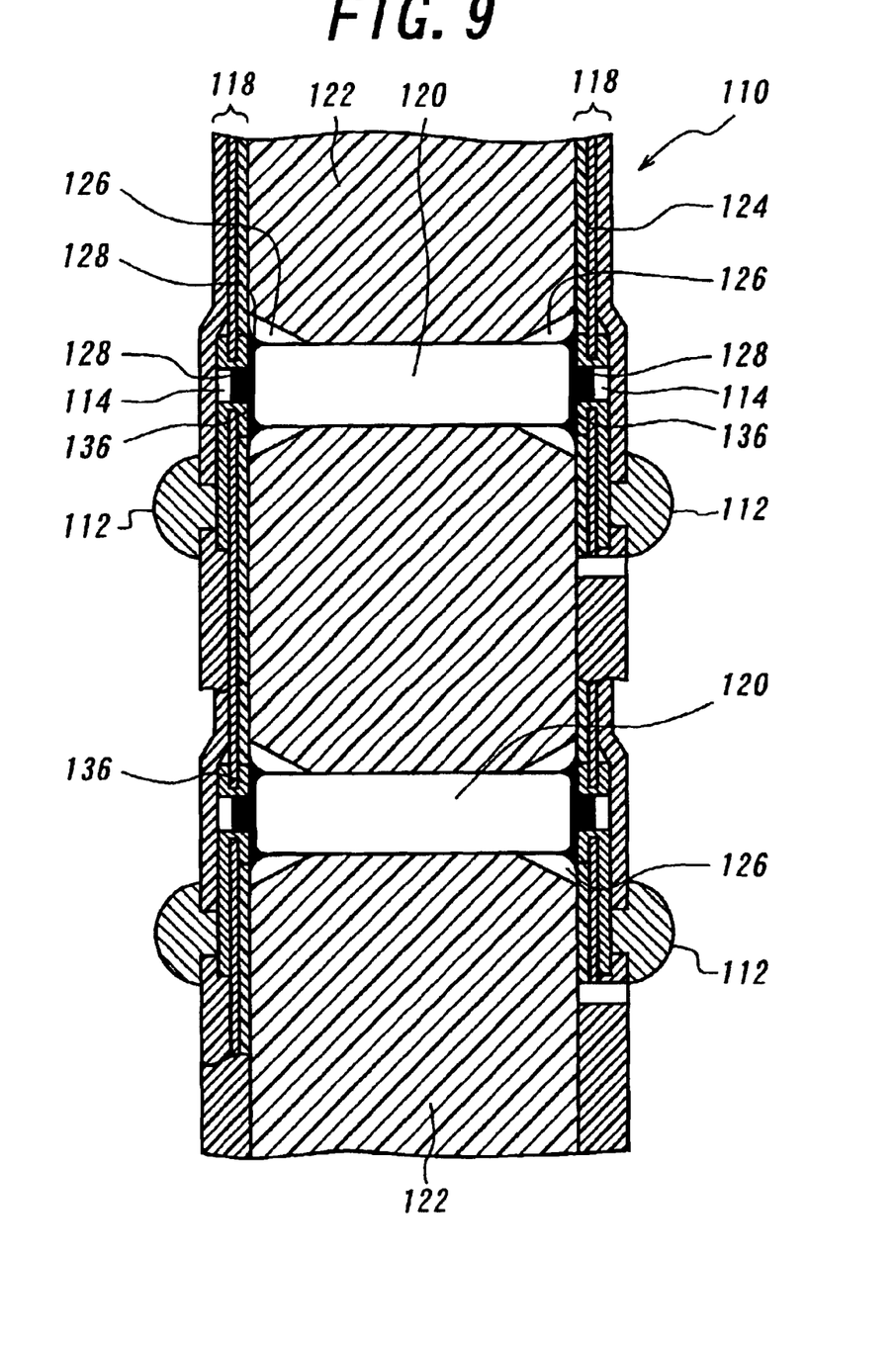
FIG. 9 is a partly sectional view of the electrical connector having electric contacts on both surfaces shown in FIG. 8.

An electrical connector having contacts on opposite sides according to another embodiment of the invention is shown in FIGS. 8 and 9 in a top plan and a partly longitudinal sectional views, respectively. The electrical connector 110 includes fine lead wires 120 and an elastomer layer or board 122. The lead wires 120 are inserted and embedded in the elastomer layer 122 which is formed with recesses 126 around peripheries of apertures in which the fine lead wires 120 are embedded. The ends of the fine lead wires 120 extend into the recesses 126 of the elastomer layer 122, respectively.

In short, an important aspect of the invention is the elastomer layer or board 122 having the plurality of fine lead wires 120 embedded therein and extending rectilinearly substantially at right angles to both the surfaces of the elastomer layer 122 and the recesses 126 around peripheries of the apertures in which the fine lead wires 120 are embedded. The fine lead wires 120 have a length substantially equal to the thickness of the elastomer layer 122, or greater than the thickness such that both the ends of the fine lead wires 120 extend slightly beyond both the surfaces of the elastomer layer 122. The diameter of the fine lead wires 120 may be determined in consideration of pitches of the electric contacts and conductivity of the fine lead wires 120.

Preferred materials from which to form the fine lead wires 120 include brass, beryllium copper, phosphor bronze, pure copper, pure silver, pure gold and the like in consideration of the imposed requirements with respect to soldability, rigidity and electric conductivity.

FIG. 10A to FIG. 10D illustrate recesses 126 in section around the peripheries of the apertures formed in the elastomer layer 122 for embedding the lead wires 120 therein. The recesses 126 serve to prevent formation of bulges of the elastomer layer 122 at its both surfaces at which the lead wires extend, which would otherwise occur. As a result, shoulders 136 of the fine lead wires 120 are not covered by parts of the elastomer layer 122 and there is no need to control the length of the fine lead wires 120 severely. The length of the fine lead wires 120 may be substantially equal to or slightly longer by about 0.05 to 0.1 mm than the thickness of the elastomer board 122.

Figure 10A:
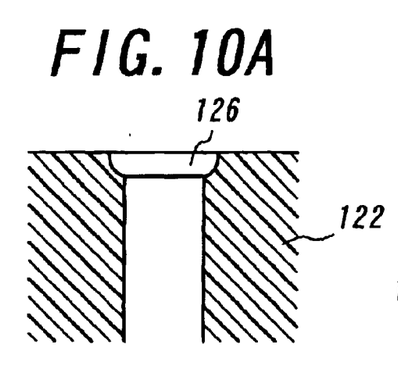
FIGS. 10A to 10D are views for explaining various shapes of recesses provided in elastomer layer around ends of fine lead wires in the electrical connector shown in FIG. 9.
Figure 10B:
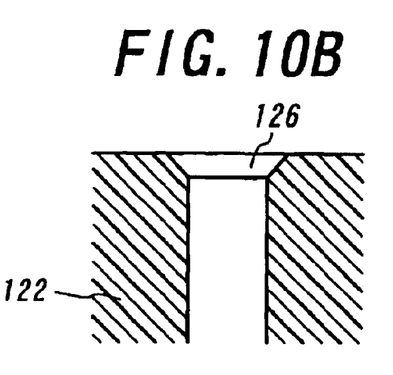
Figure 10C:
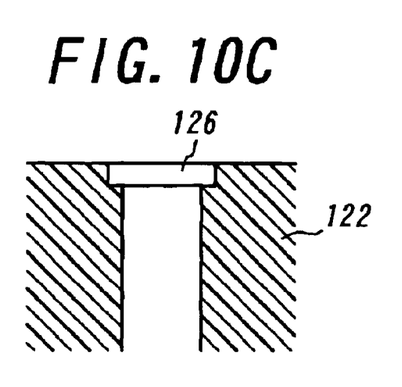
Figure 10D:
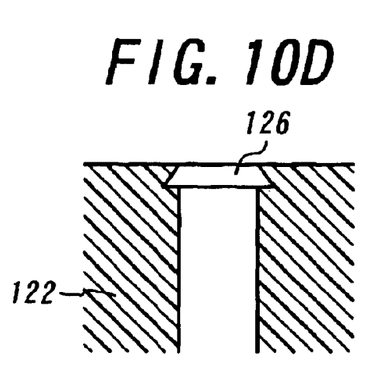

As shown in drawings, the recesses 126 may have cross-sectionally various shapes, such as dish shape (FIG. 10A) and frustoconical shape (FIG. 10B). In other embodiments a disc shape (FIG. 10C) and a shape tapered off toward outward (FIG. 10D) may be used. So long as it can prevent any bulge around the periphery of the aperture for the lead wire and can provide a space for soldering between the fine lead wire 120 and the connection portion of a through-hole 114 of a flexible printed circuit board 118, any cross-sectional shapes of the recesses 126 may be used. A size of the recesses 126 may be suitably designed in consideration of the function of the recesses 126, strength of elastomer layer or board 122 and holding force of the board for the fine lead wires 120.

Figure 11A:
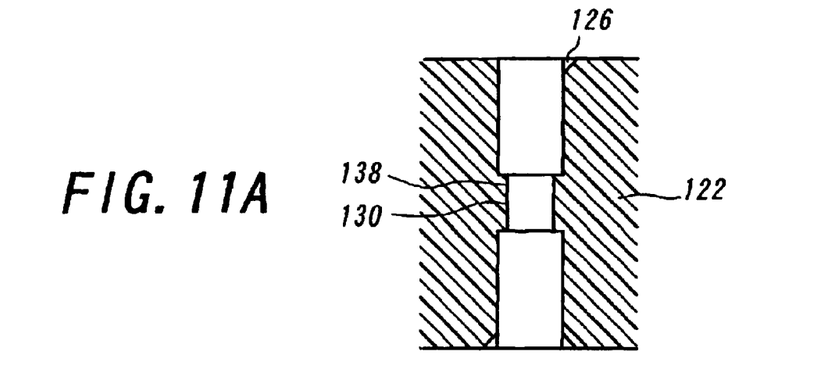
FIGS. 11A to 11C are views for explaining various shapes of smaller diameter portions of fine lead wires of the electrical connector shown in FIG. 9.

After the fine lead wires 120 have been inserted into the apertures formed in the elastomer board 122, the fine lead wires 120 may often axially move in the elastomer board 122 to cause a flexible printed circuit board 118 to be deflected or warped. In order to insure the stability of the fine lead wires 120 held in the elastomer layer 122 by preventing the deflection of the flexible printed circuit board 118, the fine lead wires 120 are each formed at a substantially mid portion with at least one smaller diameter portion 130 as shown in FIG. 11A. When the fine lead wire 120 is embedded in the aperture of the elastomer layer 122, part of the elastomer layer 122 extend toward the smaller diameter portion 130 as shown at 138 to hold the fine lead wire 120 in a stable condition to prevent the fine lead wire 120 from sliding out of the aperture.

Figure 11B:
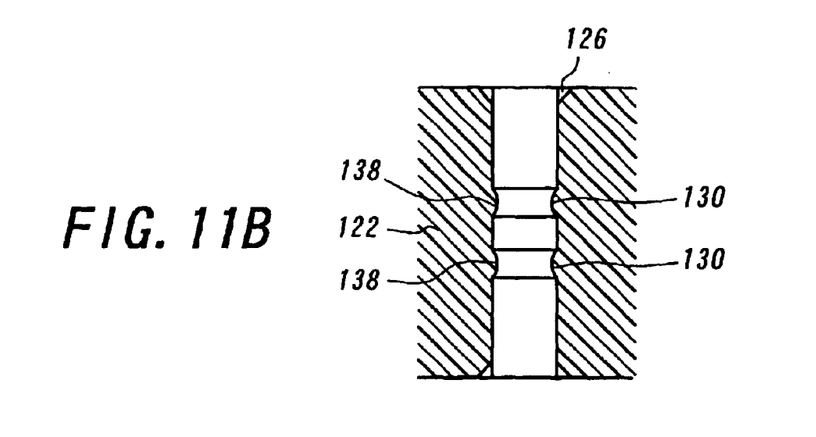
Figure 11C:
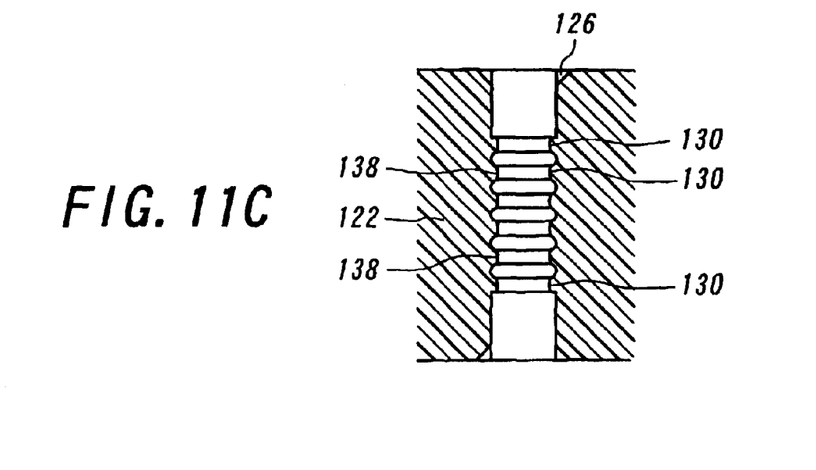

A fine lead wire 120 shown in FIG. 11B has two smaller diameter portions 130 in the form of a groove having an arc-shaped bottom in section. In the embodiment shown in FIG. 11C, a fine lead wire 120 has a number of smaller diameter portions 130 having a cross-section similar to that shown in FIG. 11B. These smaller diameter portions 130 form therebetween a number of collar portions whose edges are rounded as shown in the drawing. Parts of the elastomer layer or board 122 extend toward the smaller diameter portions 130 of the fine lead wire 120 to prevent it from moving in its axial direction, whereby the fine lead wire 120 is firmly held in the elastomer layer 122.

Mounting flexible printed circuit boards 118 onto both the sides of the connector 110 will be explained. The flexible printed circuit boards 118 each include electric contacts 112 adapted to contact electric contacts of the mating package, connection portions each formed with a through-hole 114 passing therethrough, and conductors 124 each connecting the connection portion to the electric contact 112. The flexible printed circuit boards 118 are each jointed to one of the surfaces of the elastomer layer or board 122 such that ends of the fine lead wires 120 are aligned with the through-holes 114 of the boards 118.

The electric contacts 112 have a shape which is optimized with respect to the shape of mating contacts in consideration of connection thereto. As shown in FIG. 9, the fine lead wires 120 do not extend into the through-holes 114 of the connection portions of the flexible printed circuit boards 118, and shoulders 136 of the fine lead wires 120 are only aligned with and close to connection portions of the flexible printed circuit boards 118, so that an operator can disregard the strength of connection portions of the fine lead wires 120.

A solder 128 provides an electric connection between the two contacts 112 located at front and rear surfaces through the fine lead wire 120 and through the conducting portion of the printed circuit board 118.

Figure 13:
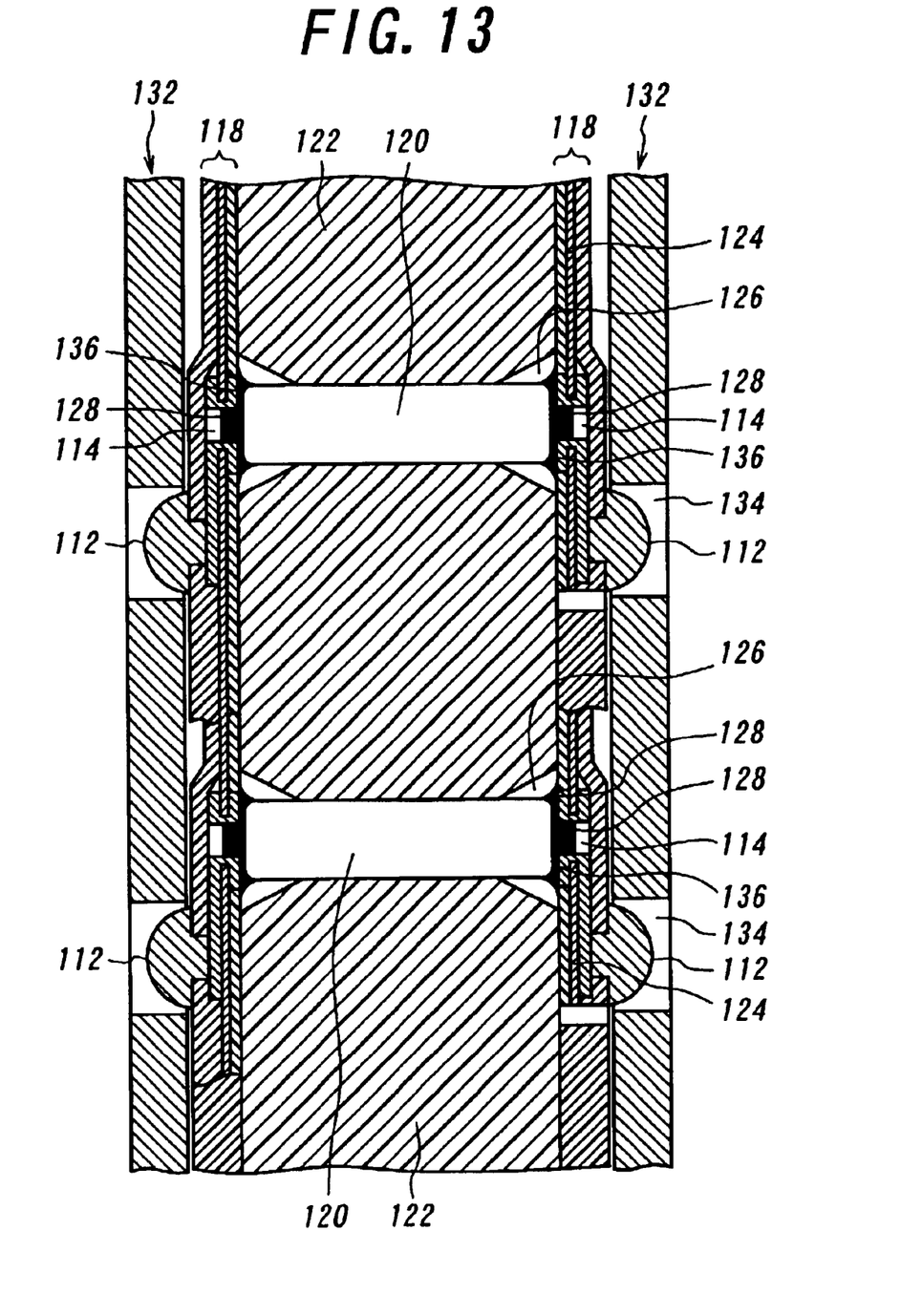
FIG. 13 is a partly sectional view illustrating the electrical connector shown in FIG. 9 clamped by the restraining jigs shown in FIG. 12.

Finally, a method for soldering the connection portions of the flexible printed circuit boards 118 and the fine lead wires 120 will be explained. In this case, the flexible printed circuit boards 118 and the fine lead wires 120 are jointed together by vapor reflow soldering, while the flexible printed circuit boards 118 and the elastomer layer 122 are restrained on both the sides by means of restraining jigs 132 to prevent the connection portions of the boards 118 from moving away from the elastomer layer 122.

In other words, this soldering method is for the case that the shoulders (connection portions) 136 of the fine lead wires 120 and the connection portions of the flexible printed circuit boards 118 are covered by the elastomer layer or board (insulator) 122 such that circumferences of the shoulders 136 of the fine lead wires 120 are covered by the elastomer layer or board 122.

Figure 12:
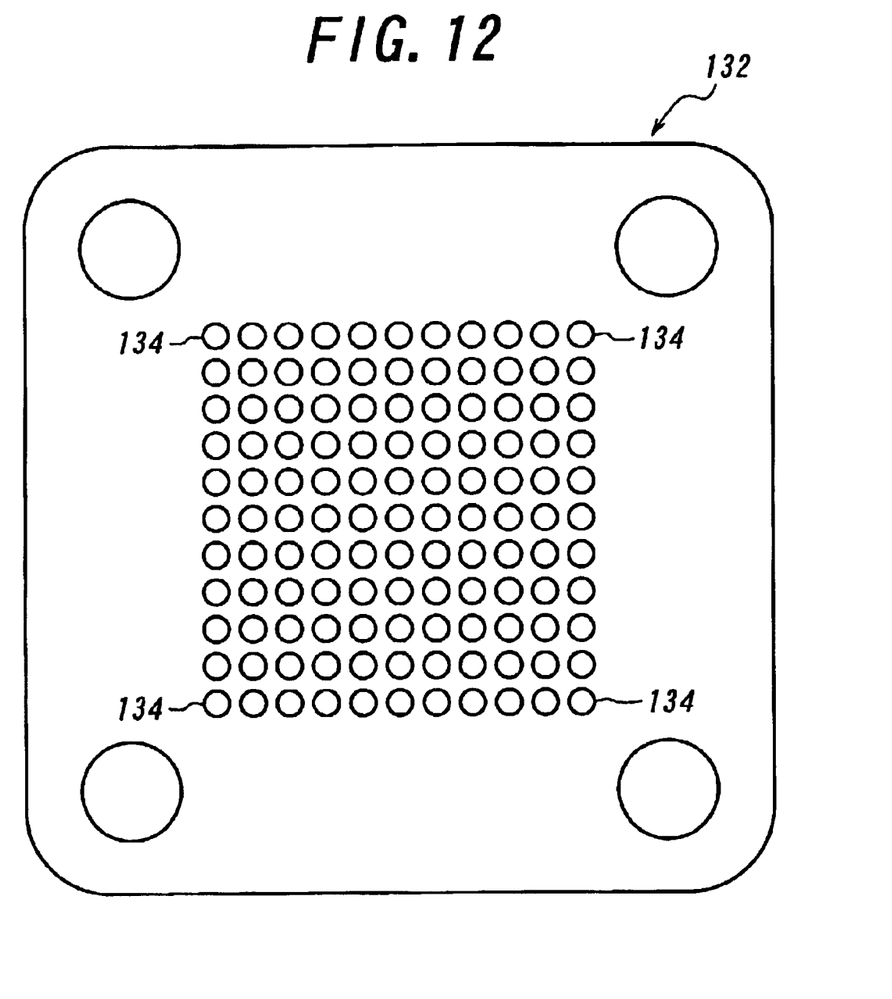
FIG. 12 is a top plan view of a restraining jig according to the invention.

The restraining jig 130 is made of a metal by mechanically cutting and formed with a required number of through-holes 134 in order to avoid any interference from the electric contacts 112. The through-holes 134 are approximately 0.01 to 0.08 mm larger in diameter than the electric contacts 112. The restraining jigs 132 are fixed to the elastomer board 122 and the flexible printed circuit boards 118 on both the sides thereof by means of set screws and clips to prevent the boards 118 from moving away from the elastomer layer or board 122, and the assembly thus clamped is then transferred into a vapor reflow soldering apparatus.

The through-holes 134 in the restraining jigs 132 not only prevent any interference from the electric contacts 112 but also facilitate visual ascertaining whether the soldering has been completed and make it easy to transfer the heat to locations to be soldered in vapor reflow soldering. In the illustrated embodiment, the through-holes 134 are arranged in a pattern such that the restraining jigs can be commonly used in both the flexible printed circuit boards 118.

In the case, moreover, that the soldering is effected in the state that the fine lead wires 120 extend slightly beyond the elastomer layer 122 into the through-holes 114 of the flexible printed circuit boards 118, the restraining jigs 132 are formed with through-holes (not shown) positionally corresponding to the through-holes 114 of the flexible printed circuit boards 118.

While the invention has been particularly shown and described with reference to preferred embodiments thereof, it will be understood by those skilled in the art that the foregoing and other changes in form and details can be made therein without departing from the spirit and scope of the invention.

What is claimed is:

1. An electrical connector having electric contacts on two surfaces, comprising flexible circuit boards on both surfaces, an elastomer layer and a plurality of fine lead wires embedded in said elastomer layer and extending rectilinearly therein at right angles to both surfaces of said elastomer layer, recesses being formed in said elastomer layer around peripheries of openings of through-holes in which said fine lead wires are embedded.

2. The electrical connector having electric contacts on two surfaces as set forth in claim 1, wherein said fine lead wires have a length substantially equal to the thickness of said elastomer layer.

3. The electrical connector having electric contacts on two surfaces as set forth in claim 1, wherein said recesses are substantially frustoconical.

4. The electrical connector having electric contacts on two surfaces as set forth in claim 1, wherein said recesses are substantially disc shaped.

5. An electrical connector having electric contacts on two surfaces, comprising an elastomer layer and a plurality of fine lead wires embedded in said elastomer layer and extending rectilinearly therein at right angles to both surfaces of said elastomer layer, recesses being formed in said elastomer layer around peripheries of openings of through-holes in which said fine lead wires are embedded wherein said fine lead wires have a length substantially equal to the thickness of said elastomer layer, further comprising flexible printed circuit boards each comprising electric contacts to be connected to mating contacts, connection portions each formed with a through-hole passing therethrough, and conductors each electrically connecting said connection portion to said electric contact, said flexible printed circuit boards being jointed to said elastomer layer each on one of said both surfaces such that ends of said fine lead wires are aligned with said through-holes of said flexible printed circuit boards.

6. An electrical connector having a required number of electric contacts adapted to contact mating contacts, wherein said electric contacts each form an electric contact element with a conductor electrically connecting said electric contact to the opposite side of a board through a through-hole formed in said board, and said electric contact elements are electrically independent of one another after electrolytic surface treatment by cutting off electrical connections between said electric contact elements for said electrolytic surface treatment and wherein said electric contacts are electrically independent of one another by cutting off electrical connection therebetweeen by forming substantially U-shaped slits around said electric contacts after said electrolytic surface treatment.

7. An electrical connector having electric contacts on two surfaces, comprising an elastomer layer and a plurality of fine lead wires embedded in said elastomer layer and extending rectilinearly therein at right angles to both surfaces of said elastomer layer, recesses being formed in said elastomer layer around peripheries of openings of through-holes in which said fine lead wires are embedded, wherein said fine lead wires to be embedded in said elastomer layer each have at least one smaller diameter portion.

8. An electrical connector having electric contacts on two surfaces, comprising an elastomer layer and a plurality of fine lead wires embedded in said elastomer layer and extending rectilinearly therein at right angles to both surfaces of said elastomer layer, recesses being formed in said elastomer layer around peripheries of openings of through-holes in which said fine lead wires are embedded wherein said fine lead wires have a length substantially equal to the thickness of said elastomer layer, further comprising flexible printed circuit boards each comprising electric contacts to be connected to mating contacts, connection portions each formed with a through-hole passing herethrough, and conductors each electrically connecting said connection portion to said electric contact, said flexible printed circuit boards being jointed to said elastomer layer each on one of said both surfaces such that ends of said fine lead wires are aligned with said through-holes said flexible printed circuit boards and wherein said connection portions of said flexible printed circuit boards and said fine lead wires are soldered by vapor reflow soldering, while said flexible printed circuit boards are urged against said elastomer layer such that said connection portions of said flexible printed circuit boards are not moved away from the elastomer layer during said vapor reflow soldering.

9. A method for producing an electrical connector having a required number of electric contacts adapted to contact mating electric contacts, comprising an electric contact element producing step which comprises steps of forming a pattern on one surface of a board, removing unwanted copper foils by etching, applying a predetermined electrolytic surface treatment to electric contact element, and cutting off electrical connections between the electric contact elements to render said electric contact elements electrically independent of one another, wherein said cutting off step, said electrical connections between the electric contact elements are cut off by forming substantially U-shaped slits around said electric contacts after said surface-treatment.

10. A method for producing an electrical connector having a required number of electric contacts adapted to contact mating contacts, including the steps of forming electric contact elements, each having one electric contact and a conductor electrically connecting the electric contact to the opposite side of a board through a through-hole formed in said board, electrically connecting said electric contact elements for performing electrolytic surface treatment; and forming substantially U-shaped slits around said electric contacts to render said electric contact elements electrically independent of one another, wherein the step of forming said electric contact elements comprises steps of forming prepared through-holes, performing a surface treatment of said through-holes and a whole surface of said board, forming a pattern on the surface of the board, removing unwanted copper foils by etching, attaching a covering layer onto the whole surface, partly opening the covering layer at locations corresponding to the electric contacts to expose the board, providing the electric contacts electrolytically, applying said electrolytic surface-treatment onto said electric contacts, opening said covering layer at said through-holes, and forming said substantially U-shaped slits around said electric contacts.

11. An electrical connector having a required number of electric contacts adapted to contact mating electric contacts, wherein said electric contacts are formed by producing a pattern on one surface of a board, removing unwanted copper foils by etching, applying a predetermined electrolytic surface treatment to electric contact elements, and cutting off electrical connections between the electric contact elements to render said electric contact elements electrically independent of one another, wherein said electric contacts are electrically independent of one another by cutting off electrical connections therebetween by forming substantially U-shaped slits around said electric contacts after said electrolytic surface treatment.

* * * * *